(12) United States Patent
Feldtkeller

(10) Patent No.: US 12,323,158 B2
(45) Date of Patent: Jun. 3, 2025

(54) ANALOG-TO-DIGITAL CONVERTER AND METHOD FOR ANALOG-TO-DIGITAL CONVERSION

(71) Applicant: Infineon Technologies Austria AG, Villach (AT)

(72) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 158 days.

(21) Appl. No.: 17/986,471

(22) Filed: Nov. 14, 2022

(65) Prior Publication Data

US 2023/0163776 A1 May 25, 2023

(30) Foreign Application Priority Data

Nov. 23, 2021 (EP) .................................... 21209997

(51) Int. Cl.
*H03M 1/36* (2006.01)
*H03M 1/12* (2006.01)
*H03M 1/28* (2006.01)

(52) U.S. Cl.
CPC ......... *H03M 1/368* (2013.01); *H03M 1/1245* (2013.01); *H03M 1/285* (2013.01)

(58) Field of Classification Search
CPC ..... H03M 1/368; H03M 1/1245; H03M 1/285
USPC ........................................ 341/159, 155, 144
See application file for complete search history.

(56) References Cited

U.S. PATENT DOCUMENTS

| 5,072,221 | A | * | 12/1991 | Schmidt | H03M 1/0809 341/159 |
| 5,691,722 | A |  | 11/1997 | Wang | |
| RE37,716 | E | * | 5/2002 | Sutardja | H03M 1/1061 341/122 |
| 8,930,499 | B2 |  | 1/2015 | Khuu et al. | |
| 10,979,066 | B1 | * | 4/2021 | Huang | H03M 1/468 |

(Continued)

OTHER PUBLICATIONS

Daponte P et al: "A Full Neural Gray-Code-Based ADC", IEEE Transactions on Instrumentation and Measurement, IEEE, USA, vol. 45, No. 2, Apr. 1, 1996 (Apr. 1, 1996), pp. 634-639, XP000591444.

(Continued)

*Primary Examiner* — Peguy Jean Pierre
(74) *Attorney, Agent, or Firm* — Armis IP Law, LLC

(57) ABSTRACT

An analog-to-digital converter is provided which is configured to output an n-bit signal in response to an analog input signal. n is greater than 1. The converter comprises n comparators, where each comparator is configured to output one bit of the n-bit signal and comprising a first input and a second input. A first comparator is configured to receive the analog input signal at its first input and a reference value at its second input and to output the first, most significant bit of the n-bit signal. For the remaining comparators, an i-th comparator, i=2 . . . n, is configured to output an i-th bit, the analog-to-digital converter comprises a respective i-th input device. The i-th input device is configured to selectively provide one of $2^{i-1}$ reference values to one of the first or second input of the i-th comparator and the analog input signal to the other one of the first or second input of the i-th comparator, such that the n-bit signal is a Gray code representation of the analog input signal.

30 Claims, 8 Drawing Sheets

(56) References Cited

U.S. PATENT DOCUMENTS

2001/0040523 A1* 11/2001 Gendai ................ H03M 1/142
  341/154
2009/0289827 A1* 11/2009 Elliott ................ H03M 1/1245
  341/161

OTHER PUBLICATIONS

EP Extended Search Report, EP 21 209 997.2, May 9, 2022, pp. 1-10.
Martinelli G et al: "Synthesis of Feedforward Neural Analogue-Digital Convertors", Proceedings of the Institution of Electrical Engineers, Institution of Electrical Engineers, Stevenage, GB, vol. 138, No. 5, Oct. 1, 1991 (Oct. 1, 1991), pp. 567-574, XP000265475.
Sick L et al: "A dynamic reference A/D converter", IEEE TENCON 2003, Conference on Convergent Technologies for the Asia-Pacific Region. Bangalore, India, Oct. 15-17, 2003; [IEEE Region 10 Annual Conference], New York, NY : IEEE, US, vol. 3, Oct. 15, 2003 (Oct. 15, 2003), pp. 1045-1049, XP010687425.

* cited by examiner

ANALOG-TO-DIGITAL CONVERTER AND METHOD FOR ANALOG-TO-DIGITAL CONVERSION

RELATED APPLICATION

This application claims priority to earlier filed European Patent Application Serial Number EP 2120 9997 entitled "POWER CONVERTER CONTROLLER, POWER CONVERTER AND METHOD," filed on Nov. 23, 2021, the entire teachings of which are incorporated herein by this reference.

TECHNICAL FIELD

The present application relates to analog-to-digital converters and to methods for analog-to-digital conversion.

BACKGROUND

Analog-to-digital converters generally relate to devices converting an analog input signal like a voltage signal or current signal into a digital signal. For example, in this way analog signals may be further processed digitally. One application of such analog-to-digital converters are integrated circuit devices that contain mainly analog functions, but in which for some functions a digital solution is desired. For example, analog solutions like sample and hold circuits, peak detectors or tendency detectors for detecting a rising or falling slope of a signal may use integrated capacitors. Integrated capacitors are difficult to implement because leakage currents in the circuit may discharge such capacitors faster than the signal changes.

In such cases a digital solution may be implemented using for example a successive approximation register (SAR) or sigma-delta analog-to-digital converter, which require a clock signal and state machines to derive the desired digital signal from the output of the converter. Typically, clock generators for providing a corresponding clock signal require trimming, as the relevant components have high fabrication tolerances. Trimming causes extra logistic effort if the integrated circuit device itself does not need trimming of other parameters than the clock generator. For example, components like a bandgap reference may have sufficient accuracy without trimming, so if, apart from the clock generator, only such components not requiring trimming are present, the provision of the clock generator alone causes the trimming to be required.

Therefore, for example, for low-cost solutions analog-to-digital converters operating without a clock signal are desirable. Generally, conventional analog-to-digital converter (ADC) not needing a clock signal include a resistor ladder to provide a plurality of reference voltage levels. Furthermore, a conventional ADC may include a comparator for each level to be determined, comparing an analog input signal to be converted with one of the reference values generated by the resistor ladder. The output of such a converter has a so-called thermometer code and may for example be used for bar graph displays where only a limited number of levels need to be determined, for example 16 different levels.

SUMMARY

An analog-to-digital converter as defined in claim 1 and a method as defined in claim 11 are provided. The dependent claims define further embodiments.

According to an embodiment, an analog-to-digital converter configured to output an n-bit signal in response to an analog input signal, where n is greater than 1, is provided, comprising:

n comparators, each comparator configured to output one bit of the n-bit signal and comprising a first input and a second input, wherein a first comparator of n comparators is configured to receive the analog input signal at its first input and a reference value at its second input and to output the first, most significant bit of the n-bit signal, wherein for an i-th comparator, i=2 . . . n, configured to output an i-th bit, the analog-to-digital converter comprises a respective i-th input device configured to selectively provide one of $2^{i-1}$ reference values to one of the first or second input of the i-th comparator and the analog input signal to the other one of the first or second input of the i-th comparator such that the n-bit signal is a Gray code representation of the analog input signal.

According to another embodiment, an analog-to-digital conversion method for outputting an n-bit signal in response to an analog input signal, where n is greater than 1, is provided, where the method uses n comparators, each comparator configured to output one bit of the n-bit signal and comprising a first input and a second input, wherein the method comprises:

providing the analog input signal to a first input of a first comparator of the n comparators and a reference value to a second input of the first comparator, and obtaining the first, most significant bit of the n-bit signal at the output of the first comparator, and, for each i-th bit, i=2 . . . , selectively providing one of $2^{i-1}$ reference values to one of the first or second input of a respective i-th comparator and the analog input signal to the other one of the first or second input of the i-th comparator, and obtaining the i-th bit of the n-bit signal at the output of the i-th comparator, such that the n-bit signal is a Gray code representation of the analog input signal.

The above summary gives merely a brief overview over some embodiments and is not to be construed as limiting in any way.

BRIEF DESCRIPTION OF THE DRAWINGS

Various embodiments will be described referring to the attached drawings, wherein.

DETAILED DESCRIPTION

In the following, various embodiments will be described referring to the attached drawings. These embodiments are to be taken as examples only and are not to be construed as limiting in any way. For example, while embodiments may be described including a plurality of features (components, elements, devices, acts, events, steps or the like), in other embodiments some of these features may be omitted or replaced by alternative features. In addition to the features explicitly shown and described, further features may be provided, for example features used in conventional analog-to-digital converters. Features from different embodiments may be combined to form further embodiments. Variations, modifications or details described with respect to one of the embodiments may also be applied to other embodiments and will therefore not be described repeatedly.

Connections or couplings described with respect to the figures refer to electrical connections or couplings. Such connections or couplings may be modified, for example by additional intervening elements or by removing elements, as long as the general purpose of the connection or coupling, for example to provide a certain signal, to supply a voltage or a current etc. is essentially maintained.

In the following, n-bit analog-to-digital converters will be described. For ease of explanation, the most significant bit (MSB) will be referred to as bit 1, followed by the next most significant bit as bit 2, and so on, until bit n, which is the least significant bit. This somewhat differs from the naming convention most frequently used, where the least significant bit is referred to as bit 0, but facilitates explanation of the operation of analog-to-digital converters described herein. As a matter of course, changing the naming convention does not change the function of the analog-to-digital converter per se.

Figure 1:
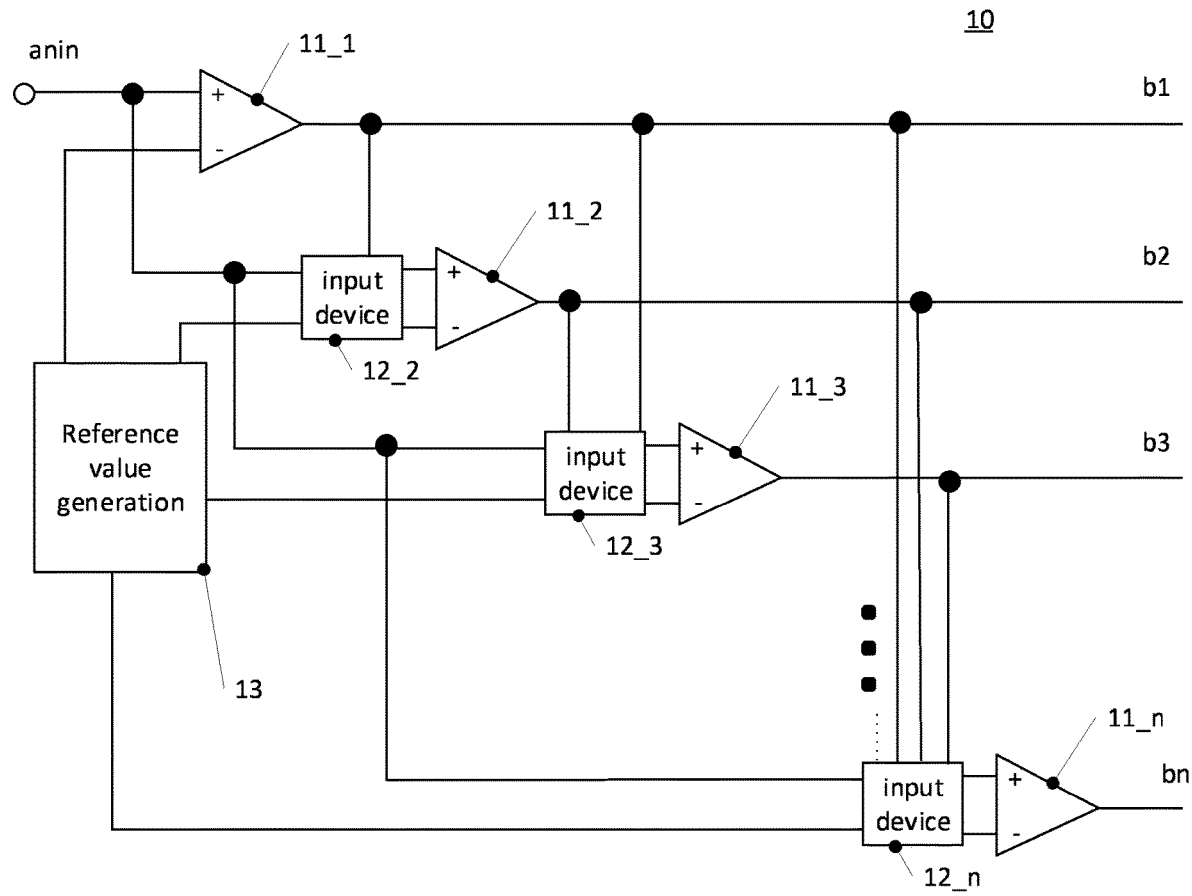
FIG. 1 is a block diagram of an analog-to-digital converter according to an embodiment.

Turning now to the figures, FIG. 1 is a block diagram illustrating an analog-to-digital converter 10 according to an embodiment. Analog-to-digital converter 10 receives an analog input signal anin and outputs an n-bit signal with bits b1 to bn, wherein n is greater than 1, for example 3 or more. For each bits b1 to bn, a comparator 11 is provided, labeled 11_1 for bit b1, 11_2 for bit b2 ... until 11_n for bit bn, and collectively referred to as comparators 11. Comparator 11_1 receives the analog input signal anin at a positive input thereof and a reference value received from a reference value generation circuit 13 at a negative input thereof. Typically, the reference value for comparator 11_1 will be half of the full scale of signal anin. For example, if anin has a range from 0 to 10 V, the reference value provided to the negative input of comparator 11_1 would be about 5 V.

Furthermore, each comparator 11_i, i=2 ... n (in case of n=2 to be understood as only the second comparator 11_2), has a respective input device 12_i assigned thereto. The input device 12_i receives the analog input signal anin and $2^{i-1}$ reference values (for example two reference values for input device 12_2, four reference values for input device 12_3 etc.). The reference values provided to input device 12_i may be set to a value between the reference values provided to the previous input device 12_i–1 (or the reference value provided to comparator 11_1 for i=2), zero and full scale. For example, as for comparator 11_1 the reference value may be half of full scale, for input device 12_2 the reference values are between zero and half of full scale (e.g. 1/4 full scale) and between half of full scale and full scale (e.g. 3/4 full scale). For input device 12_3, the reference values would then be arranged between the reference values of the previous comparators, zero and full scale, for example at 1/8, 3/8, 5/8 and 7/8 of full scale for input device 12_3.

The respective input device provides the analog input signal anin selectively to either the positive or the negative input of the respective comparator and provides a selected reference value of the assigned $2^{i-1}$ reference values to the other one of the positive or negative input of the i-th comparator. The selections which reference value is provided and to which of the respective inputs of the i-th comparator the selected reference value and the analog input signal anin are provided, are made based on output signals of the comparator for the previous (more significant) bits, i.e. based on the output signals of comparator 11_1 to 11_i–1 for each i-th input device 12_i, as illustrated by corresponding connections in FIG. 1. The selection is performed such that the output signal b1 ... bn represents the analog input signal as a Gray code. The Gray code is a code in which adjacent code words differ in one bit only, i.e. for example for a continuously increasing input signal anin only one bit changes at a given time. Specific examples for the implementation of input devices to achieve this will be discussed further below.

Figure 2:
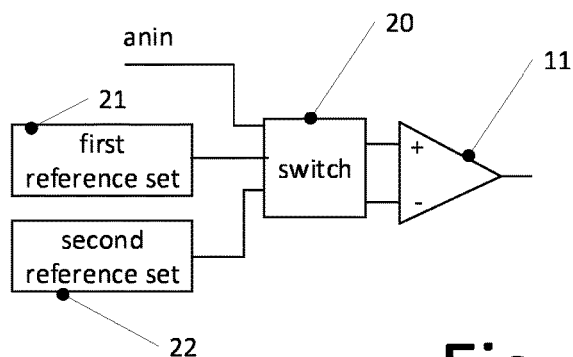
FIG. 2 is a block diagram of a stage of an analog-to-digital converter according to an embodiment.

FIG. 2 illustrates a stage of an analog-to-digital converter according to an embodiment, which illustrates a possible implementation of input devices 12 including a switch device 20, a first reference set 21 and a second reference set 22. First reference set 21 and second reference set 22 each provide, in case of a comparator 11_i of FIG. 1, one of $2^{i-2}$ reference values (i.e. in case of comparator 11_2 each reference set 21, 22 provides only a single value, for example 1/4 full scale and 3/4 full scale, respectively, as explained above, for comparator 11_3 each reference set 21, 22 selectively provides one of two reference values etc.).

The reference values of the first and second reference set differ from each other and may be interleaved with each other, such that starting from zero up to full scale the reference values are alternatingly assigned to first reference set 21 or second reference set 22. The selection of the reference value in each reference set, and the selection from which reference set a reference value is used, depends on output signals of previous (higher bit) comparators, as explained with reference to FIG. 1. Switch device 20, in a first switch position, provides analog signal anin to the positive input of comparator 11, and a reference value of first reference set 21 to the negative input of comparator 11. In a second switch position, switch 20 provides a reference value provided by second reference set 22 to the positive input of comparator 11, and the analog input signal anin to the negative input of comparator 11. This selection is again based on outputs from previous, more significant bit comparators, for example based on an exclusive OR combination thereof.

Figure 3:
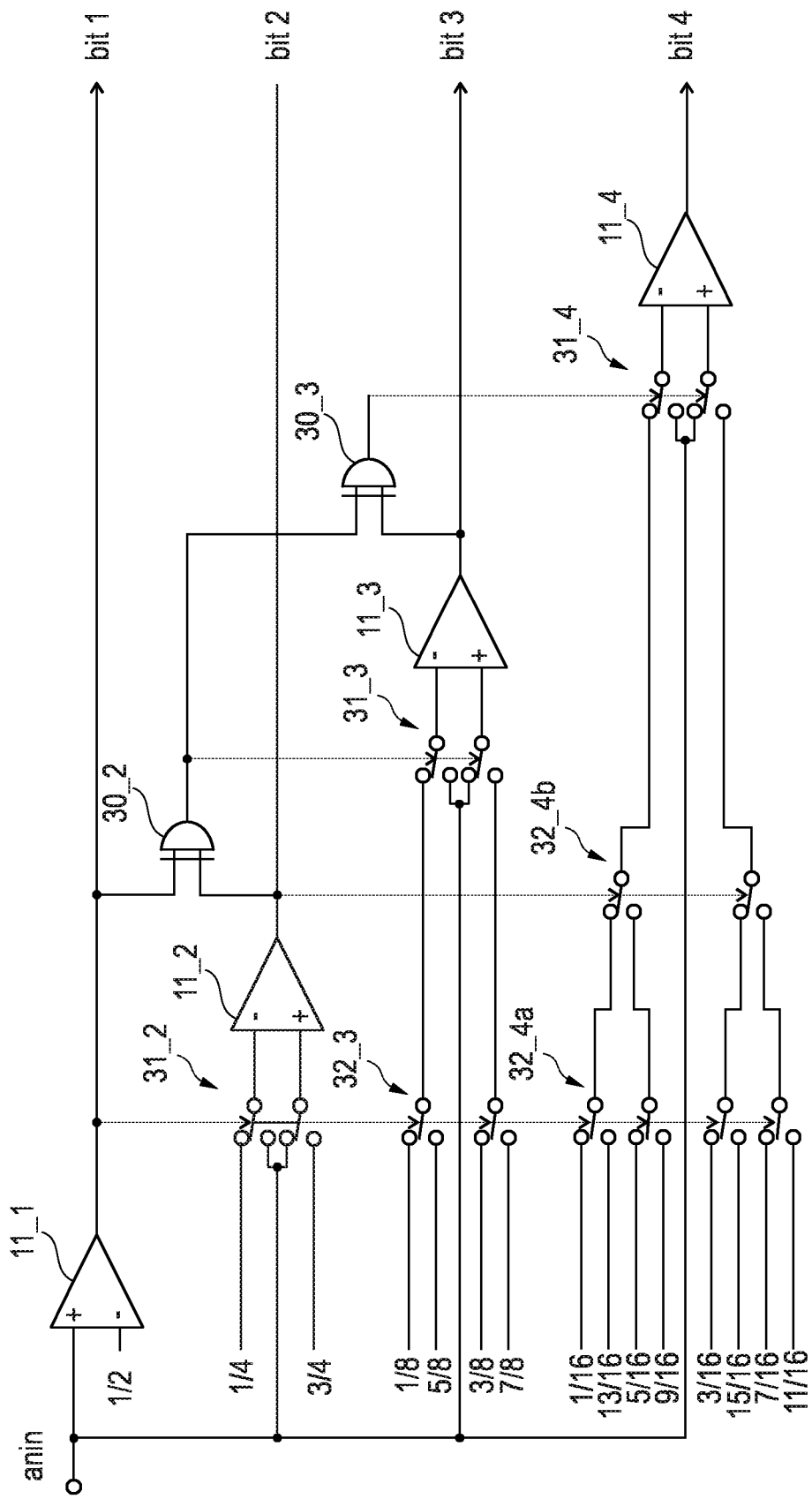
FIG. 3 is a circuit diagram of an analog-to-digital converter according to an embodiment.

FIG. 3 illustrates an embodiment of an analog-to-digital converter according to an embodiment, which in the example shown in FIG. 3 is a 4-bit converter with four comparators 11_1 to 11_4.

Reference values are indicated in FIG. 3 and in the description of FIGS. 3 to 5 below in relation to a full scale of input signal anin, i.e. "1/2" for comparator 11_1, "1/4" and "3/4" for comparator 11_2 etc., meaning 1/2 of full scale, 1/4 of full scale and 3/4 of full scale, respectively. The reference values may for example be provided using a resistive divider from a common reference voltage generator (not shown).

Comparator 11_1, at a positive input thereof, receives analog input signal anin, and at a negative input thereof receives a reference value "1/2", i.e. 1/2 of full scale. The output of comparator 11_1 is output as most significant bit, bit 1, of the Gray code, which is 1 if anin exceeds 1/2 full scale and 0 otherwise.

Comparator 11_2 has a switch device 31_2 assigned thereto, the function of which corresponds to switch device 20 of FIG. 2. In a first position of switch device 31_2, reference value "1/4" is provided to the negative input of comparator 11_2, and analog input signal anin is provided to a positive input of comparator 11_2. In a second position of switch device 31_2, analog input signal anin is provided to the negative input of comparator 11_2, and reference value "3/4" is provided to the positive input of comparator 11_2. In this case, therefore, "1/4" corresponds to first reference set 21, and "3/4" corresponds to the second reference set 22 of FIG. 2.

Switch devices corresponding to switch device 31_2 are provided to comparators 11_3 and 11_4, as switch devices 31_3 and 31_4, respectively. Switch device 31_3 is controlled via an XOR combination of the output signals of comparators 11_1, 11_2 provided by an XOR gate 30_2, and switch device 31_4 is controlled by an XOR combination of the output signals of comparators 11_1, 11_2, 11_3 provided by XOR gate 30_2 and a further XOR gate 30_3, as shown.

Furthermore, the reference values provided to switch devices 31_3, 31_4 are selected, i.e. here the first reference set 21 and the second reference set 22 comprise more than one reference value, which are selected. For switch device 31_3, a switch stage 32_3 controlled by the output signal of comparator 11_1 selects, on the one hand, one of reference values "1/8" and "5/8" for providing to switch device 31_3 (first reference set) and on the other hand one of reference values "3/8" and "7/8" (second reference set). For switch device 31_4, two switch stages 32_4a and 32_4b are provided as shown, where stage 32_4a is controlled by the output signal of comparator 11_1, and stage 32_4b is controlled by the output signal of comparator 11_2. A first reference value of a first reference set is therefore selected from "1/16", "13/16", "5/16" and "9/16" to be provided to switch device 31_4, and from a second reference set including "3/16", "15/16", "7/16" and "11/16" also a second reference value is selected to be provided to switch device 31_4.

It should be noted that the switch logic of FIG. 3 is merely an example for implementing the respective provision of reference values and analog input signal to the comparators, and other circuits may also be used. For example, in some embodiments, as will be described later referring to FIG. 6, the reference values may be generated by a digital-to-analog converter.

To further illustrate the operation of embodiments, example signals are shown in FIGS. 4A to 4D, for a 4-bit converter as shown in FIG. 3 (or implemented for n=4 in FIG. 1).

In FIGS. 4A to 4D, a curve 40 in each of the figures represents an input signal anin for values ranging from zero to a full scale thereof, e.g. rising over time.

Figure 4A:
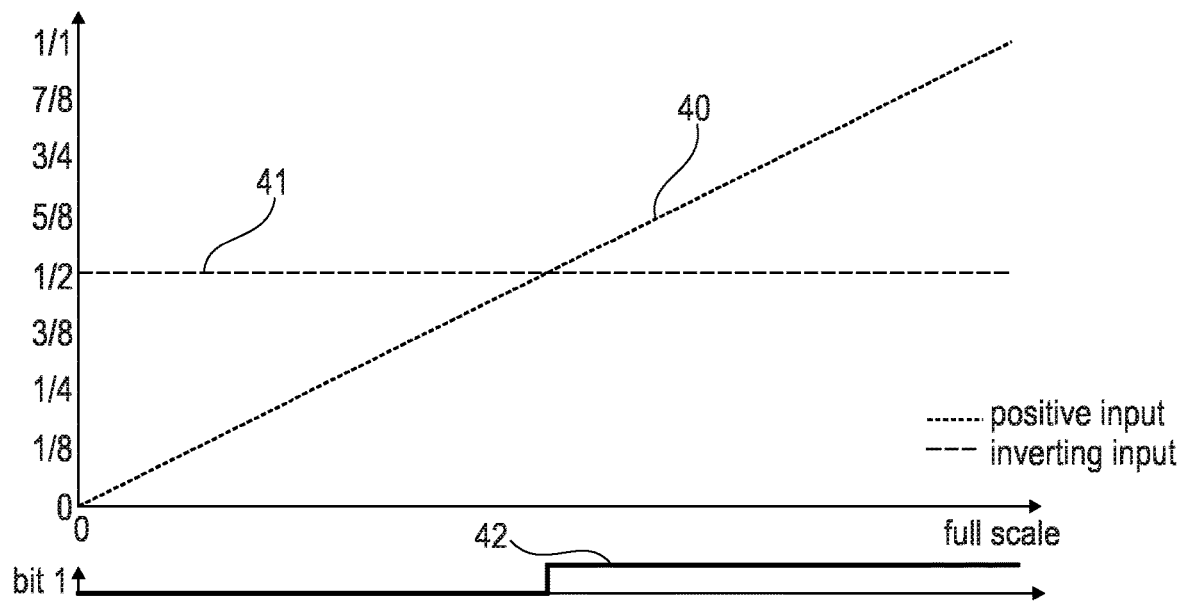
FIGS. 4A to 4D are diagrams illustrating the operation of analog-to-digital converters according to some embodiments.

FIG. 4A relates to first comparator 11_1. Here, as indicated by a curve 41, a reference value corresponding to half of full scale ("1/2") is provided. In FIGS. 4A to 4D, dotted curves or portions of curves indicate that the respective signal is provided to the positive input of the respective comparator, and a dashed curve or portion of a curve indicates that the respective signal is provided to the negative (inverting) input of the respective comparator. In case of first comparator 11_1, the analog input signal anin according to curve 40 is provided to the positive input of comparator 11_1 for the complete range of the input signal, and the reference value according to curve 41 is applied to the negative input throughout. A curve 42 shows the value of bit 1 resulting. As soon as the analog input signal according to curve 40 exceeds the reference value represented by curve 41, bit 1 toggles and goes from low to high, as shown by curve 42.

Figure 4B:
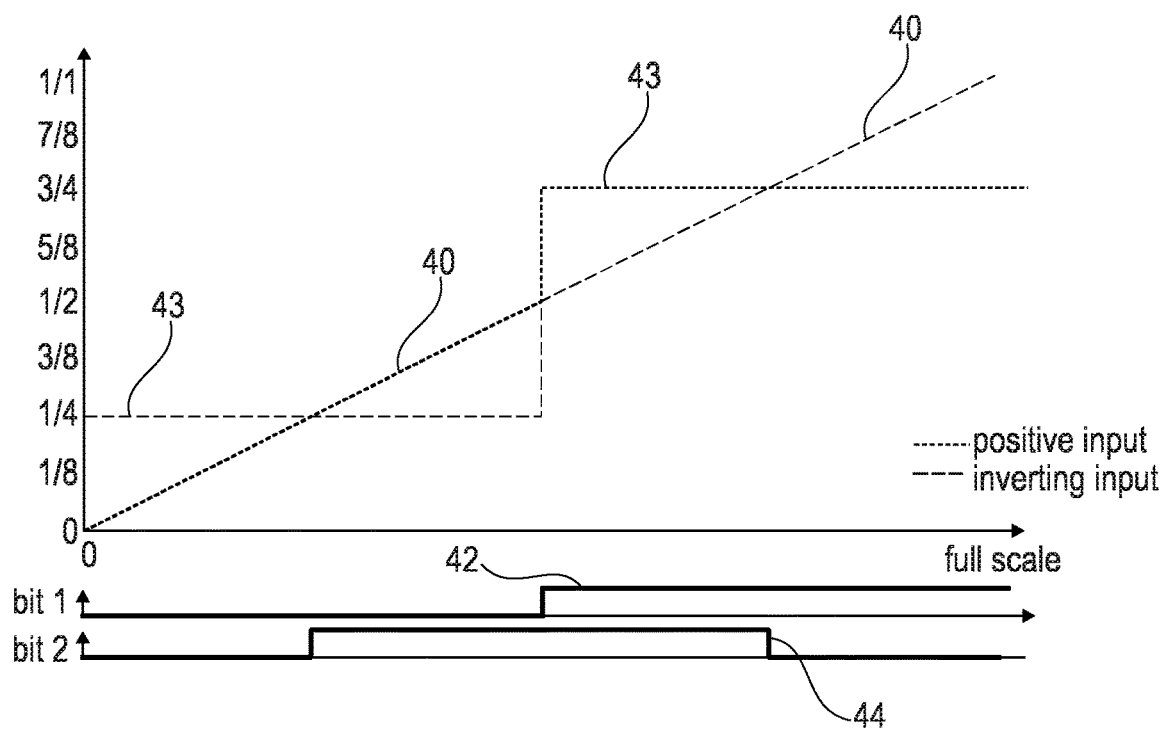

FIG. 4B shows corresponding curves for the second comparator 11_2. Curve 40 again represents the analog input signal, and curve 43 represents the reference value applied to comparator 11_2, which in this case may be either "1/4" or "3/4".

As shown in FIG. 4B, as soon as the analog input signal represented by curve 40 exceeds the reference value "1/4", bit 2 represented by a curve 44 toggles and goes from low to high. At the time where bit 1 toggles according to curve 42 (see FIG. 4A, i.e. when the analog input signal exceeds the reference value "1/2"), the inputs of the second comparators are switched, i.e. now the analog input signal according to curve 40 is applied to the negative input of the comparator. Furthermore, the reference value switches from "1/4" to "3/4", such that now the reference value of "3/4" is applied to the positive input, while previously the reference value of "1/4" was applied to the negative input. This corresponds for example to the operating of switch device 31_2 of FIG. 3 or input device 12_2 of FIG. 1. It should be noted that at this point the output of comparator represented by curve 44 does not toggle, as in both cases the positive comparator input receives a higher input than the negative comparator input.

This has the consequence that as soon as the analog input signal exceeds the reference value of "3/4", bit 2 toggles again and goes from high to low, as can be seen by curve 44 in FIG. 4B.

Figure 4C:
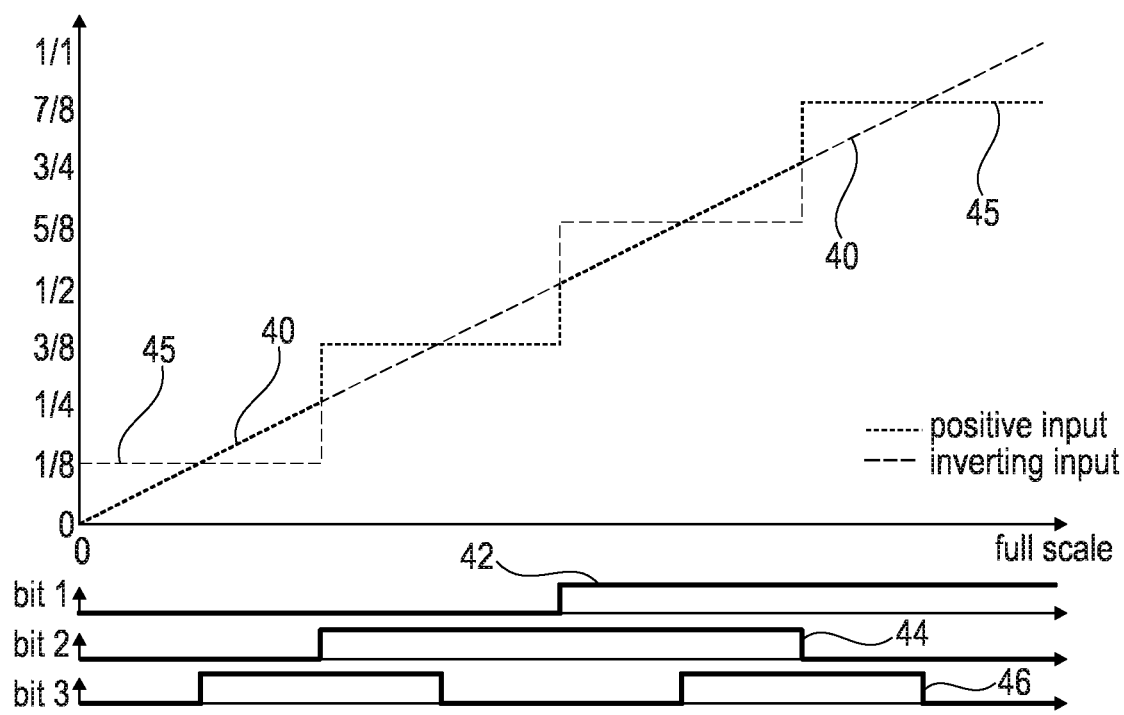

FIG. 4C shows the situation for comparator 11_3. Here, according to a curve 45 one of four different reference values, "1/8", "3/8", "5/8" and "7/8", are applied. The reference value changes each time bit 1 or bit 2 toggles, corresponding to the operation of switches 32_3 and 31_3 of FIG. 3. Furthermore, also whether the analog input signal according to curve 40 is applied to the positive or negative input changes based on an exclusive OR combination of bits 1 and 2. This results in a bit 3 as represented by a curve 46 in FIG. 4C.

Figure 4D:
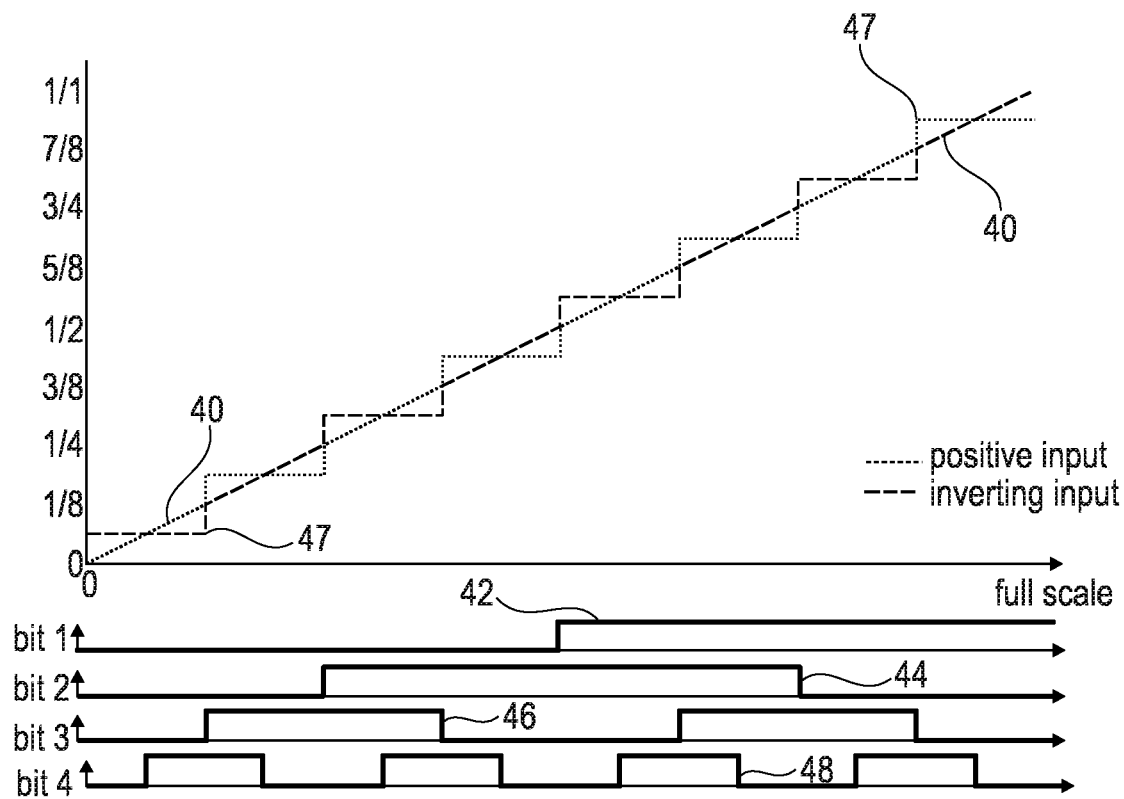

Finally, FIG. 4D shows the situation for bit 4, where according to curve 47 one of eight reference values is applied, depending on the state and toggling of bits 1, 2 and 3. This results in a bit 4 as illustrated by a curve 48 in FIG. 4D. Bits 1 to 4 represent the analog input signal as a Gray code. As can be seen in FIG. 4D, with rising input signal anin according to curve 40, at each given point in time at most one of bits 1 to 4 toggles, i.e. there is no situation where two bits toggle simultaneously, unlike a conventional bit coding.

For transitions of the input signal anin, as can be seen in FIG. 4D from curves 42 to 48, the output of the analog-to-digital converter is always valid if the input signal anin changes slowly enough that the corresponding comparator output, all switch positions and all comparator input levels can settle within the time when the input signal crosses any reference value to the time when the input signal crosses the next higher or lower reference value. In case the analog input signal anin changes faster, at least the comparators for the more significant bits (bit 1, bit 2) can follow the input and are always valid. Generally, therefore, an error may be introduced if the input changes faster than the comparators can follow due to the propagation delays.

The Gray code may be converted to a conventional binary code using a series of exclusive OR gates, as known to a skilled person. Such a binary code may then, if needed for a certain application, be converted again to analog using a conventional digital-to-analog converter like an R/2R digital-to-analog converter. Furthermore, a Gray code digital signal if needed may be converted directly back to analog using a resistive string and a cascade of switches, also in a conventional manner.

Next, variations and additions to the above embodiments will be described.

The XOR gates 30_2, 30_3 have a certain propagation delay, for example in case of implementation in CMOS technology of a few nanoseconds, while comparators have a propagation delay in the order of 100 nanoseconds. Therefore, in many implementations the propagation delays of the XOR gate do not adversely affect the operation of the comparators, the effect may be negligible.

Figure 5:
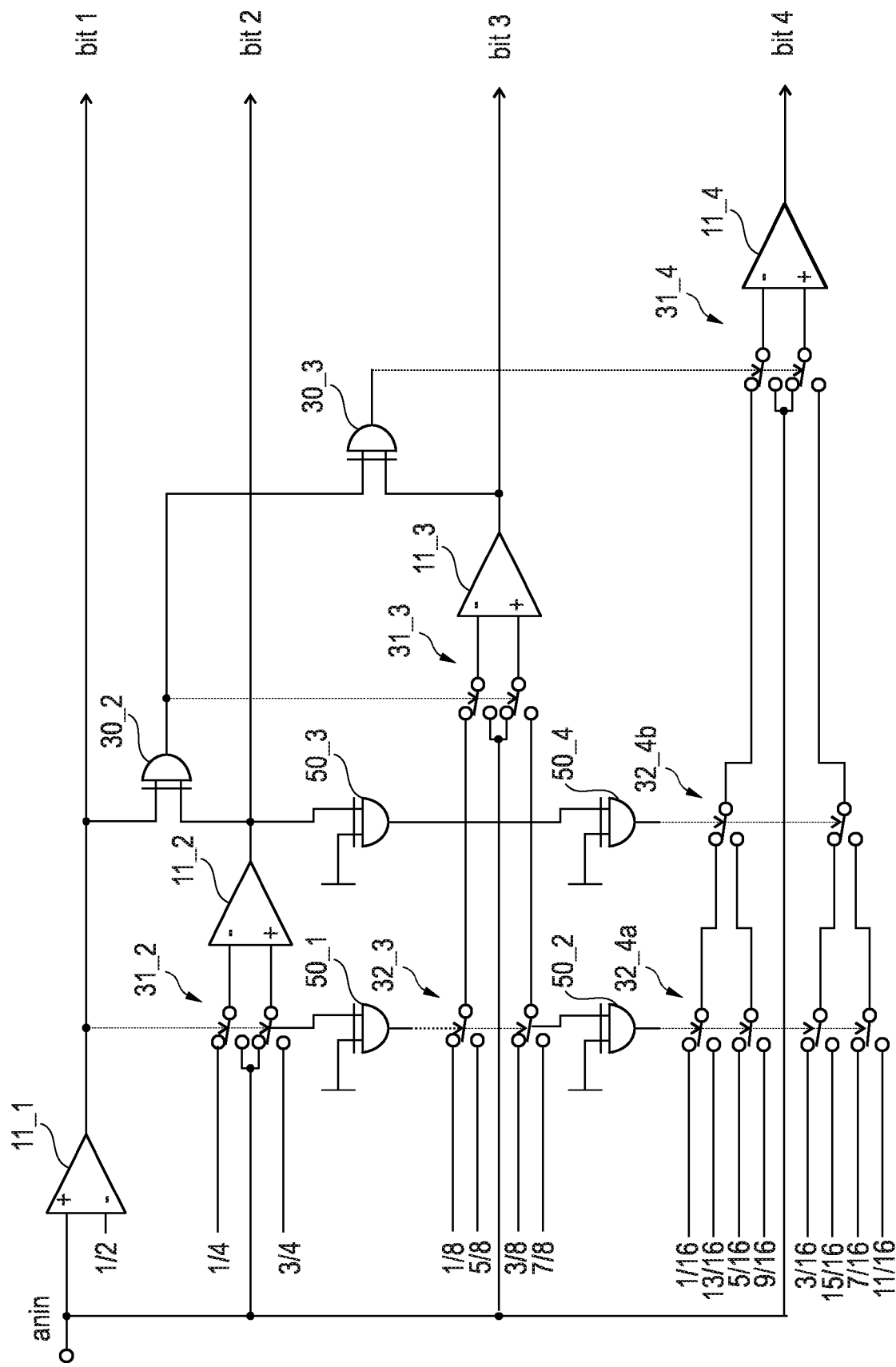
FIG. 5 is a circuit diagram of an analog-to-digital converter according to an embodiment.

Nevertheless, to mitigate the influence of this delay further, FIG. 5 illustrates an analog-to-digital converter according to a further embodiment, where dummy XOR gates (with one input always zero) 50_1, 50_2, 50_3, 50_4 are added as shown, such that the propagation delays for the control signals for a specific bit (for switch device 31_3 or 31_4, respectively, and switch stages 32_3, 32_4A, 32_4B, respectively) are more similar to each other for a specific bit. For example, for bit 4 all these control signals controlling switches pass two XOR gates. As the delay of XOR gates also depends on the direction the gate switches (from output logic 1 to 0 or vice versa), this may not provide a full delay compensation, but at least a partial delay compensation.

Figure 6:
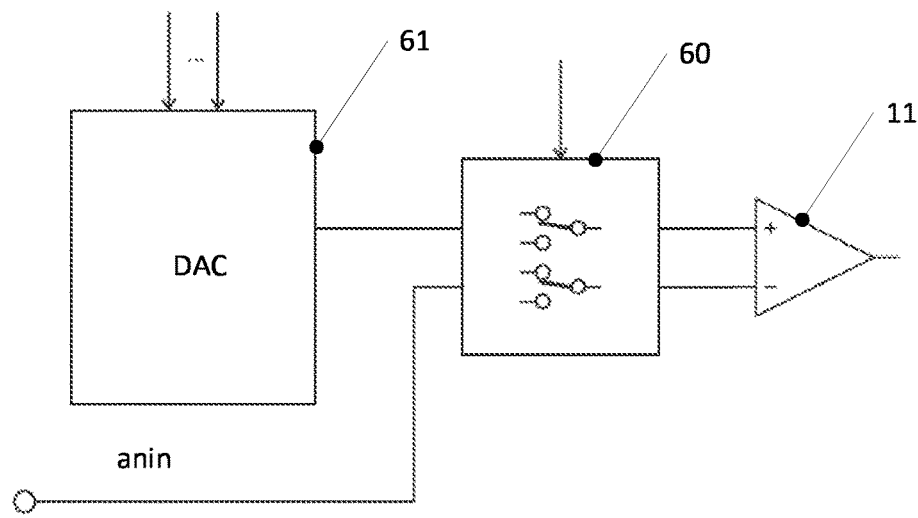
FIG. 6 illustrates a stage of an analog-to-digital converter according to an embodiment.

As mentioned, reference values may be provided for example by a resistive divider, and then may be selected via switches as shown in FIG. 3 or 5. In another embodiment shown in FIG. 6, reference values may be provided via a digital-to-analog converter. FIG. 6 illustrates a corresponding stage, i.e. combination of comparator and input device. The stage of FIG. 6 may be applied to all comparators 11_i, i>2. Here, a switch device 60 is coupled to comparator 11, which selectively provides the analog input signal anin to one of the positive or negative input of comparator 11 and a reference value provided by a digital-to-analog converter 61 to the other one of the positive or negative input. Digital-to-analog converter 61 obtains a digital reference value based on the number of the bit (i) and the outputs of previous comparators by some logic circuit (for example, for bit 2 either a reference value of digital 1/4 or 3/4 full scale) and then outputs a corresponding analog value based on the digital reference value as the reference value.

Figure 7:
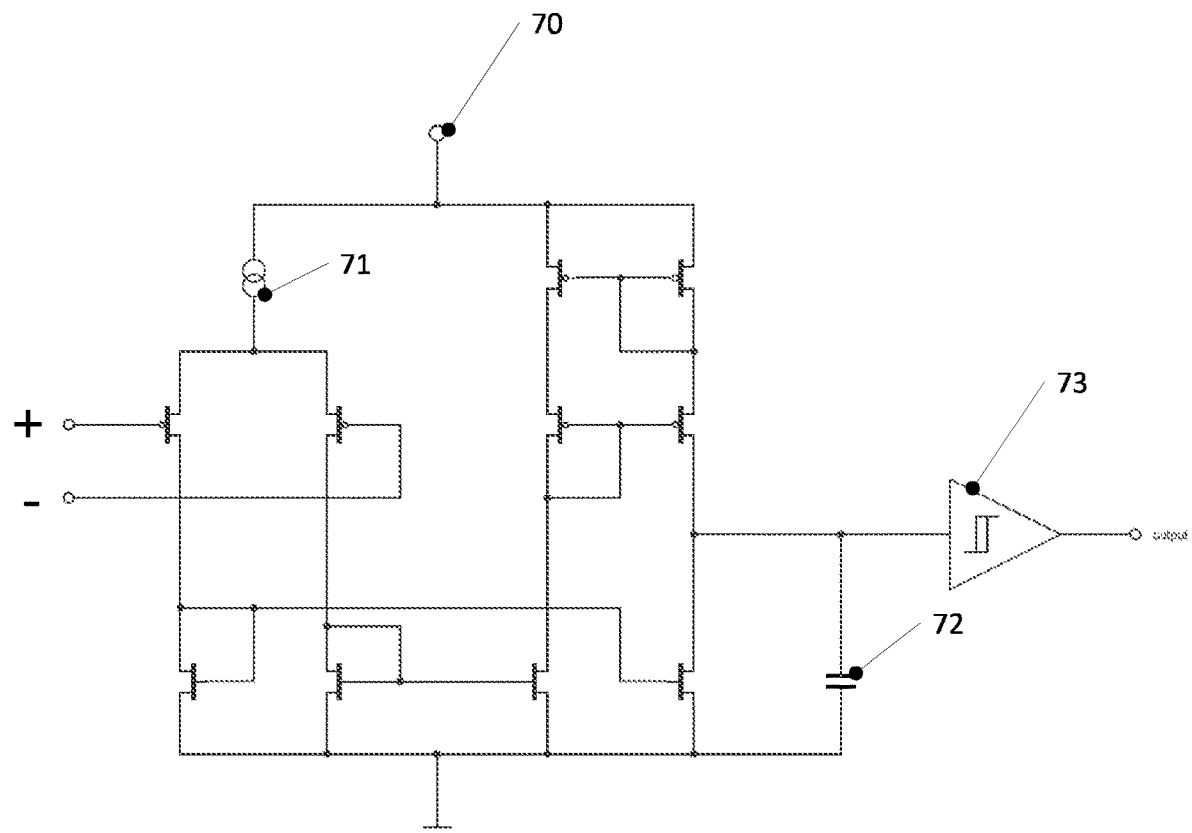
FIG. 7 illustrates an example implementation of a comparator usable in some embodiments.

As mentioned above referring to FIG. 5, with additional XOR gates delays may be partially compensated. In some embodiments, furthermore comparators which allow increasing the propagation delay and therefore are more tolerant against propagation delays for the switching signals may be used. An example implementation of such a comparator is shown in FIG. 7. The comparator of FIG. 7 includes a positive input (+), a negative input (−), a supply input 70, a current source 71, two transistor stages as shown, an output capacitor 72 and a Schmitt trigger 73, where an output of the comparator is provided at the output of Schmitt trigger 73. The capacitor 72 in combination with a hysteresis of Schmitt trigger 73 filters out glitches caused by delay variations at the inputs of the comparator. The example comparator of FIG. 7 uses a Wilson current mirror in the second stage prior to the Schmitt trigger 73. Compared to widely used cascade current mirrors, this solution consumes less current at high differential voltages at the comparator inputs.

However, other comparator implementations may also be used.

The output bits of the analog-to-digital converter may be stored and held for example by a set of latches or registers. Latching or registering Gray code data requires no setup or hold times, as only one bit changes at a time and the stored result represents either the state before the bit change or the state after the bit change, but no other combination corresponding to a completely different level, unlike binary code that must not be stored or latched without applying setup and hold times.

Figure 8:
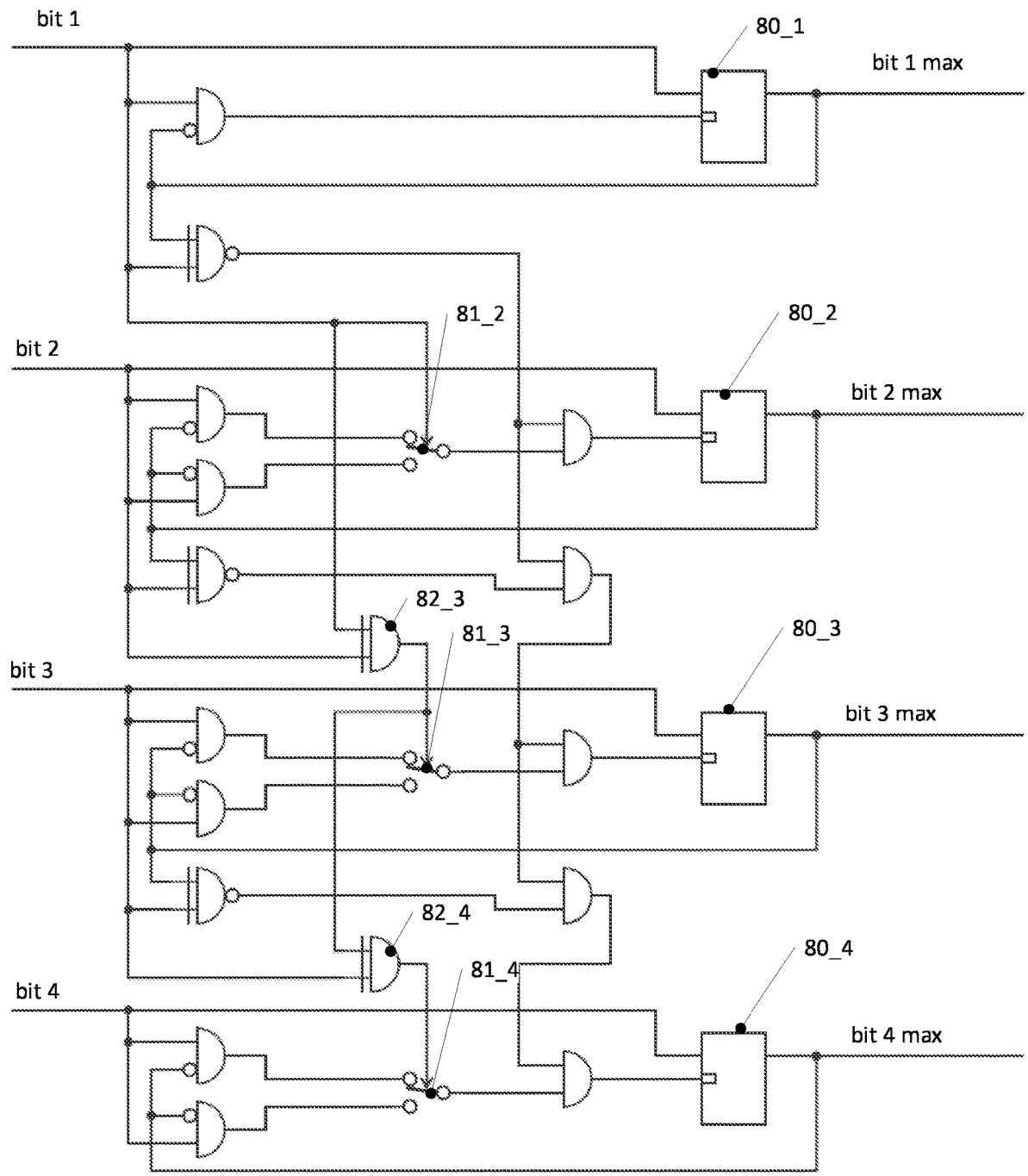
FIG. 8 illustrates an implementation of a peak detector usable in conjunction with an analog-to-digital converter according to some embodiments.

One example for further processing the resulting Gray code is to detect a maximum value of the output over time. A corresponding embodiment of an asynchronous maximum detector is shown in FIG. 8. "Asynchronous" refers to the fact that the detector requires no clock signal. The maximum detector of FIG. 8 receives the bits of the Gray code, in the example of FIG. 8 four bits bit 1 to bit 4, and outputs corresponding bits bit 1 max to bit 4 max of a maximum value. For each bit, the maximum detector of FIG. 8 includes a respective latch 80, i.e. 80_1 for bit 1, 80_2 for bit 2, 80_3 for bit 3 and 80_4 for bit 4. Each of latches 80 is set to transparent if the input of the respective latch represents a higher analog value than the output and is set back to hold (not transparent) if input and output of the respective latch are equal or if the input represents a lower value than the output. This is ensured by feedbacks from the outputs to a control input of the latch via logic gates. To take values of higher bits into account, switches 81_2, 81_3, 81_4 are used which are controlled via XOR gates 82_3, 82_4 (or directly by bit 1 in case of switch 81_2). While switches 81 are shown in FIG. 8, these may be implemented as digital multiplexers. The shown logic in this way ensures that only one latch can be set to transparent at a given time. Setting a lower value latch to transparent requires that all higher value inputs and outputs are equal.

In particular, for the latch of the most significant bit 1, latch 80_1, one logic gate is used to switch it to transparent or hold. This series of XOR gates is similar to the generation of the Gray code illustrated in FIG. 3. In other words, for each i-th bit, i=1−n, a respective i-th latch 80_i is configured to receive the i-th bit. The logic shown in FIG. 8 is configured such that of the n latches (n=4 in the example) at most one latch, the k-th latch 80_k, is switched to transparent providing its input to its output at a given time, wherein the k-th latch is selected from the first to n-th latch with decreasing priority as the latch where for the first to k−1 latches 80_1 to 80_k−1 the input corresponds to the output and for the k-th bit the decoded Gray code
    indicates a higher value of the k-th bit than stored in the k-th latch when the peak detection logic is a maximum peak detection logic, as shown, or
    alternatively indicates a lower value of the k-th bit than stored in the k-th latch when the peak detection logic is a minimum peak detection logic, which is an alternative implementation.

Figure 9:
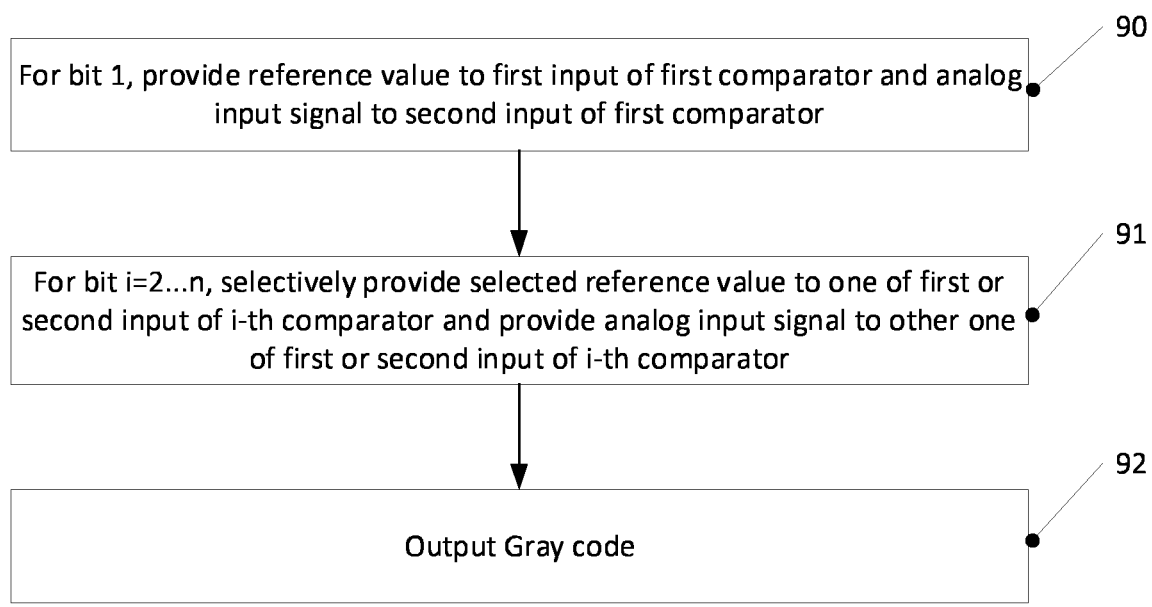
FIG. 9 is a flowchart illustrating a method according to an embodiment.

FIG. 9 is a flowchart illustrating a method according to an embodiment. The method of FIG. 9 may be implemented in the analog-to-digital converters described previously and, in order to avoid repetitions, will be described referring thereto.

At 90, for a bit 1, the most significant bit, the method comprises providing an analog input signal to a first input (positive input in case of FIG. 1) of a first comparator and a reference value to a second input of the first comparator. At 91, for the remaining bits i=2 ... n, the method comprises selectively providing a selective reference value to one of the first or second input of the i-th comparator and provide the analog input signal to the other one of the first or second input of the i-th comparator, as described above. Based on this, at 92 the method includes outputting a Gray code at the outputs of the comparators.

Some embodiments are defined by the following examples.

Example 1. An analog-to-digital converter configured to output an n-bit signal in response to an analog input signal, where n is greater than 1, comprising:
n comparators, each comparator configured to output one bit of the n-bit signal and comprising a first input and a second input,
wherein a first comparator is configured to receive a reference value at its first input and the analog input signal at its second input and to output the first, most significant bit of the n bit signal,
wherein for an i-th comparator, i=2 ... n, configured to output an i-th bit, the analog-to-digital converter comprises a respective i-th input device configured to selectively provide one of $2^{i-1}$ reference values to one of the first or second input of the i-th comparator and the analog input signal to the other one of the first or second input of the i-th comparator such that the n-bit signal is a Gray code representation of the analog input signal.

Example 2. The analog-to-digital converter of example 1, wherein each i-th input device, i=2 ... n, is configured to be controlled by a logic combination of output signals of the first through (i−1)-th comparators.

Example 3. The analog-to-digital converter of example 2, wherein the i-th input device is configured to switch the providing of the one of $2^{i-1}$ reference values and the analog input signal between the first and second inputs of the i-th comparator based on an XOR combination of the output signals of the first through -th comparators.

Example 4. The analog-to-digital converter of example 3, wherein the input device of the i-th comparator, i=2 ... n, comprises a switch device, which is configured to couple in a first position the first input of the i-th comparator to a first reference set and the second input of the i-th comparator to the analog input signal and to couple in a second position the second input of the i-th comparator to a second reference set and the first input of the i-th comparator to the analog input signal.

Example 5. The analog-to-digital converter of example 4, wherein for the i-th comparator, i=2 ... n, the first reference set is configured to provide one of first $2^{i-2}$ reference values based on a logic combination of the outputs of the first through (i−2)-th comparators and wherein the second reference set is configured to provide one of second $2^{i-2}$ reference values different from the first $2^{i-2}$ reference values based on the logic combination. For i=2 this means no logic combination (and therefore always the same reference value), as i−2=0 in this case.

Example 6. The analog-to-digital converter of any one of examples 3 to 5, further comprising delay compensation elements to mitigate differences in switching times of different stages by compensating delays caused by the XOR combinations.

Example 7. The analog-to-digital converter of any one of examples 1 to 6, wherein for providing one of $2^{i-1}$ reference values the analog-to-digital converter includes a digital-to-analog converter.

Example 8. The analog-to-digital converter of any one of examples 1 to 7, wherein the analog-to-digital converter is configured to operate independently from a clock signal.

Example 9. The analog-to-digital converter of any one of examples 1 to 8, further comprising a peak detection logic coupled to receive the n-bit signal and to determine a peak value of the n-bit signal over time.

Example 10. The analog-to-digital converter of example 9, wherein the peak detection logic is configured to operate independently from a clock signal.

Example 11. The analog-to-digital converter of example 9 or 10, wherein the peak detection logic, for each i-th bit, i=1−n, comprises an i-th latch configured to receive the 1-th bit, wherein the peak detection logic is configured such that of the n latches at most one latch, the k-th latch, is switched to transparent providing its input to its output at a given time, wherein the k-th latch is selected from the first to n-th latch with decreasing priority as the latch where for the first to k−1 latches the input corresponds to the output and for the k-th bit the decoded Gray code
indicates a higher value of the k-th bit than stored in the k-th latch when the peak detection logic is a maximum peak detection logic, or
indicates a lower value of the k-th bit than stored in the k-th latch when the peak detection logic is a minimum peak detection logic.

Example 12. An analog-to-digital conversion method for outputting an n-bit signal in response to an analog input signal, where n is greater than 1, comprising:
n comparators, each comparator configured to output one bit of the n-bit signal and comprising a first input and a second input,
providing a reference value to a first input of a first comparator and the analog input signal to a second input of the first comparator, and obtaining the 1st, most significant bit of the n bit signal, at the output of the first comparator,
and, for each i-th bit, i=2 ... n:
selectively providing one of $2^{i-1}$ reference values to one of the first or second input of a respective i-th comparator and the analog input signal to the other one of the first or second input of the i-th comparator, and obtaining the i-th bit of the n bit signal at the output of the i-th comparator, such that the n-bit signal is a Gray code representation of the analog input signal.

Example 13. The method of example 12, wherein the selectively providing for the i-th bit is based on a logic combination of output signals of the first through (i−1)-th comparators.

Example 14. The method of example 13, wherein, for the i-th bit, the selectively providing comprises switching the providing of the one of $2^{i-1}$ reference values and the analog input signal between the first and second inputs of the i-th comparator based on an XOR combination of the output signals of the first through (i−1)-th comparators.

Example 15. The method of example 14, further comprising compensating delays caused by the XOR combinations.

Example 16. The method of any one of examples 12 to 15, further comprises detecting a peak in the n-bit signal over time.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An analog-to-digital converter configured to output an n-bit signal in response to an analog input signal, where n is greater than 1, the analog-to-digital converter comprising:
n comparators, each comparator configured to output one bit of the n-bit signal and comprising a first input and a second input,
wherein a first comparator is configured to receive a reference value at its first input and the analog input signal at its second input and to output the first, most significant bit of the n bit signal,
wherein for an i-th comparator, where i=2 . . . n, configured to output an i-th bit, the analog-to-digital converter comprises a respective i-th input device configured to selectively provide one of $2^{i-1}$ reference values to one of the first or second input of the i-th comparator and the analog input signal to the other one of the first or second input of the i-th comparator such that the n-bit signal is a Gray code representation of the analog input signal.

2. The analog-to-digital converter of claim 1, wherein each i-th input device, i=2 . . . n, is configured to be controlled by a logic combination of output signals of the first through (i−1)-th comparators.

3. The analog-to-digital converter of claim 2, wherein the i-th input device is configured to switch the providing of the one of $2^{i-1}$ reference values and the analog input signal between the first and second inputs of the i-th comparator based on an XOR combination of the output signals of the first through (i−1)-th comparators.

4. The analog-to-digital converter of claim 3, wherein the input device of the i-th comparator, i=2 . . . n, comprises a switch device, which is configured to couple in a first position the first input of the i-th comparator to a first reference set and the second input of the i-th comparator to the analog input signal and to couple in a second position the second input of the i-th comparator to a second reference set and the first input of the i-th comparator to the analog input signal.

5. The analog-to-digital converter of claim 4, wherein for the i-th comparator, i=2 . . . n, the first reference set is configured to provide one of first $2^{i-2}$ reference values based on a logic combination of the outputs of the first through (i−2)-th comparators and wherein the second reference set is configured to provide one of second $2^{i-2}$ reference values different from the first $2^{i-2}$ reference values based on the logic combination.

6. The analog-to-digital converter of claim 1, wherein for providing one of $2^{i-1}$ reference values the analog-to-digital converter includes a digital-to-analog converter.

7. The analog-to-digital converter of claim 1, wherein the analog-to-digital converter is configured to operate independently from a clock signal.

8. The analog-to-digital converter of claim 1, further comprising a peak detection logic coupled to receive the n-bit signal and to determine a peak value of the n-bit signal over time.

9. The analog-to-digital converter of claim 8, wherein the peak detection logic is configured to operate independently from a clock signal.

10. The analog-to-digital converter of claim 9, wherein the peak detection logic, for each i-th bit, i=1-n, comprises an i-th latch configured to receive the 1-th bit, wherein the pe ak detection logic is configured such that of the n latches at most one latch, the k-th latch, is switched to transparent providing its input to its output at a given time, wherein the k-th latch is selected from the first to n-th latch with decreasing priority as the latch where for the first to k−1 latches the input corresponds to the output and for the k-th bit the decoded Gray code
indicates a higher value of the k-th bit than stored in the k-th latch when the peak detection logic is a maximum peak detection logic, or
indicates a lower value of the k-th bit than stored in the k-th latch when the peak detection logic is a minimum peak detection logic.

11. The analog-to-digital converter as in claim 1, wherein the one of the $2^{i-1}$ reference values is a first reference voltage; and
wherein the i-th input device is configured to switch between application of the first reference voltage to the first input of the i-th comparator and the second input of the i-th comparator.

12. The analog-to-digital converter as in claim 11, wherein the i-th input device is configured to: i) during a first condition, apply the first reference voltage to the first input of the i-th comparator and apply the analog input signal to the second input of the i-th comparator, and ii) during a second condition, apply the first reference voltage to the second input of the i-th comparator and apply the analog input signal to the first input of the i-th comparator.

13. The analog-to-digital converter as in claim 1, wherein the i-th input device is configured to: i) during a first condition, apply a first reference voltage to the first input of the i-th comparator and apply the analog input signal to the second input of the i-th comparator, and ii) a during a second condition, apply a second reference voltage to the second input of the i-th comparator and apply the analog input signal to the first input of the i-th comparator.

14. The analog-to-digital converter as in claim 1, wherein for i=2, the i-th comparator is a second comparator of the n comparators, the second comparator including an inverting input node and a non-inverting input node;
wherein for i=2, the i-th bit is a second bit of the n bit signal;
wherein for i=2, the i-th input device is a second input device of the analog-to-digital converter;
wherein the second input device includes switch circuitry operative to switch between: i) input of the analog input signal to the inverting input node of the second comparator, and ii) input of the analog input signal to the non-inverting input node of the second comparator.

15. The analog-to-digital converter as in claim 14, wherein the switch circuitry is operative to, during a first condition: i) apply the analog input signal to the non-inverting input node of the second comparator, and ii) apply a first reference voltage to the inverting input node of the second comparator; and
wherein the switch circuitry is operative to, during a second condition: i) apply the analog input signal to the inverting input node of the second comparator, and ii) apply a second reference voltage to the non-inverting input node of the second comparator.

16. An analog-to-digital conversion method for outputting an n-bit signal in response to an analog input signal, where n is greater than 1, the analog-to-digital conversion method comprising:

n comparators (11), each comparator configured to output one bit of the n-bit signal and comprising a first input and a second input,
providing a reference value to a first input of a first comparator and the analog input signal to a second input of the first comparator, and obtaining the $1^{st}$, most significant bit of the n bit signal, at the output of the first comparator, and, for each i-th bit, where i=2 . . . n:
selectively providing one of $2^{i-1}$ reference values to one of the first or second input of a respective i-th comparator and the analog input signal to the other one of the first or second input of the i-th comparator, and obtaining the i-th bit of the n bit signal at the output of the i-th comparator, such that the n-bit signal is a Gray code representation of the analog input signal.

17. The method of claim 16, wherein the selectively providing for the i-th bit is based on a logic combination of output signals of the first through (i−1)-th comparators.

18. The method of claim 17, wherein, for the i-th bit, the selectively providing comprises switching the providing of the one of $2^{i-1}$ reference values and the analog input signal between the first and second inputs of the i-th comparator based on an XOR combination of the output signals of the first through (i−1)-th comparators.

19. The method of claim 18, further comprising compensating delays caused by the XOR combinations.

20. The method of claim 16 further comprising:
detecting a peak in the n-bit signal over time.

21. An analog-to-digital converter comprising:
a first comparator operative to receive an analog input signal and a first reference value, the first comparator operative to output a first bit value of a multi-bit signal based on a comparison of the analog input signal to the first reference value;
a second comparator operative to receive the analog input signal and a second reference value, the second comparator operative to output a second bit value of the multi-bit signal based on a comparison of the analog input signal to the second reference value; and
first signal path switch circuitry operative to control selection of switching between inputting the analog input signal to a first input of the second comparator and inputting the analog input signal to a second input of the second comparator.

22. The analog-to-digital converter as in claim 21, wherein the first signal path switch circuitry includes:
first switch circuitry operative to switch between input of the analog input signal to the first input of the second comparator and input of the second reference value to the first input of the second comparator; and
second switch circuitry operative to switch between input of a third reference value to the second input of the second comparator and input of the analog input signal to the second input of the second comparator.

23. The analog-to-digital converter as in claim 22, wherein the first switch circuitry is operative to:
during a first condition: i) control the first switch circuitry to convey the analog input signal to the first input of the second comparator, and ii) control the second switch circuitry to convey the third reference value to the second input of the second comparator; and
during a second condition: i) control the first switch circuitry to convey the second reference value to the first input of the second comparator, and ii) control the second switch circuitry to convey the analog input signal to the second input of the second comparator.

24. The analog-to-digital converter as in claim 23, wherein the first bit value outputted from the first comparator is operative to control operation of the first switch circuitry and the second switch circuitry.

25. The analog-to-digital converter as in claim 21 further comprising:
a third comparator operative to receive the analog input signal and a third reference value, the third comparator operative to output a third bit value of the multi-bit signal based on a comparison of the analog input signal to the third reference value.

26. The analog-to-digital converter as in claim 25 further comprising:
second signal path switch circuitry operative to switch between inputting the analog input signal to a first input and a second input of the third comparator.

27. The analog-to-digital converter as in claim 26, wherein the second signal path switch circuitry is operative to:
during a first condition: i) control first switch circuitry of the second signal path switch circuitry to convey the analog input signal to the first input of the third comparator, and ii) control second switch circuitry of the second signal path switch circuitry to convey the third reference value to the second input of the third comparator.

28. The analog-to-digital converter as in claim 21, wherein the first signal path switch circuitry is operative to input the second reference value to the first input of the second comparator during a first condition in which the first signal path switch circuitry inputs the analog input signal to the second input of the second comparator; and
wherein the first signal path switch circuitry is operative to input a third reference value to the second input of the second comparator during a second condition in which the first signal path switch circuitry inputs the analog input signal to the first input of the second comparator.

29. The analog-to-digital converter as in claim 21, wherein the first signal path switch circuitry is controlled based on output of the first bit value.

30. The analog-to-digital converter as in claim 21, wherein the first input of the second comparator is a non-inverting input of the first comparator; and
wherein the second input of the second comparator is an inverting input of the first comparator.

* * * * *